(12) United States Patent
Butterbaugh et al.

(10) Patent No.: US 9,497,871 B2
(45) Date of Patent: Nov. 15, 2016

(54) MODULAR ENCLOSURE ELEMENTS EMPLOYING CAMS FORMING DETENT FEATURES WITH LATCHES

(71) Applicant: International Business Machines Corporation, Armonk, NY (US)

(72) Inventors: Matthew A. Butterbaugh, Rochester, MN (US); Eric A. Eckberg, Rochester, MN (US); Camillo Sassano, Durham, NC (US); Kevin L. Schultz, Raleigh, NC (US); Scott A. Shurson, Mantorville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 37 days.

(21) Appl. No.: 14/576,272

(22) Filed: Dec. 19, 2014

(65) Prior Publication Data

US 2016/0183395 A1 Jun. 23, 2016

(51) Int. Cl.
*H05K 7/00* (2006.01)
*H05K 5/02* (2006.01)
*H05K 7/18* (2006.01)
*H05K 7/14* (2006.01)

(52) U.S. Cl.
CPC .......... *H05K 5/0221* (2013.01); *H05K 5/0213* (2013.01); *H05K 5/0247* (2013.01); *H05K 7/14* (2013.01); *H05K 7/1409* (2013.01); *H05K 7/18* (2013.01); *Y10T 29/49815* (2015.01); *Y10T 29/49822* (2015.01)

(58) Field of Classification Search
USPC ............... 361/747, 755, 732, 759, 801, 802, 361/679.58, 679.02, 679.4, 724, 725, 727; 439/325, 353, 159, 296
See application file for complete search history.

(56) References Cited

U.S. PATENT DOCUMENTS

| 5,928,016 A | 7/1999 | Anderson et al. |
| 6,252,765 B1 | 6/2001 | Balzaretti et al. |
| 6,927,975 B2 * | 8/2005 | Crippen ................. G06F 1/183 312/223.1 |
| 6,939,319 B1 | 9/2005 | Anstead et al. |
| 6,956,745 B2 | 10/2005 | Kerrigan et al. |
| 7,499,271 B2 * | 3/2009 | Wagatsuma ............ G06F 1/181 361/679.33 |

(Continued)

OTHER PUBLICATIONS

International Business Machines Corporation, "List of IBM Patents or Patent Applications Treated as Related," May 16, 2016, 2 pages.
International Business Machines Corporation, U.S. Appl. No. 14/588,214, filed Dec. 31, 2014, 34 pages.
International Business Machines Corporation, U.S. Appl. No. 14/602,009, filed Jan. 21, 2015, 34 pages.

(Continued)

*Primary Examiner* — Hung S Bui
(74) *Attorney, Agent, or Firm* — Patterson + Sheridan, LLP

(57) ABSTRACT

Modular elements removable from enclosures and employing cams forming detent features with latches are disclosed. A modular element may include a chassis body supporting electronic components. The modular element is removable from or secured to an enclosure using a latch. The latch may engage the enclosure and may remain engaged with the enclosure by being secured by interfacing with a cam. By forming the cam with a predetermined shape, a detent feature may be established with the latch to secure the latch and maintain the modular element locked to the enclosure. The latch may be disengaged from the cam by applying a disengagement motion to the cam and allow the latch to move relative to the chassis body and disengage from the enclosure. In this manner, the modular element is efficiently secured and removed from the enclosure with minimum obstruction to airflow to the electronic components.

17 Claims, 5 Drawing Sheets

(56) References Cited

U.S. PATENT DOCUMENTS

| | | | |
|---|---|---|---|
| 8,416,563 B2* | 4/2013 | Hou | H05K 7/1489 |
| | | | 211/26 |
| 9,152,189 B2* | 10/2015 | Fan | G06F 1/187 |
| 2004/0008497 A1 | 1/2004 | Barringer et al. | |
| 2004/0264146 A1 | 12/2004 | Kerrigan et al. | |
| 2008/0117603 A1 | 5/2008 | Henry et al. | |
| 2012/0213577 A1 | 8/2012 | Fan | |
| 2016/0081215 A1 | 3/2016 | Boretti | |

OTHER PUBLICATIONS

International Business Machines Corporation, U.S. Appl. No. 14/586,441, filed Dec. 30, 2014, 26 pages.

International Business Machines Corporation, U.S. Appl. No. 14/584,613, filed Dec. 29, 2014, 29 pages.

International Business Machines Corporation, U.S. Appl. No. 14/587,115, filed Dec. 31, 2014, 29 pages.

* cited by examiner

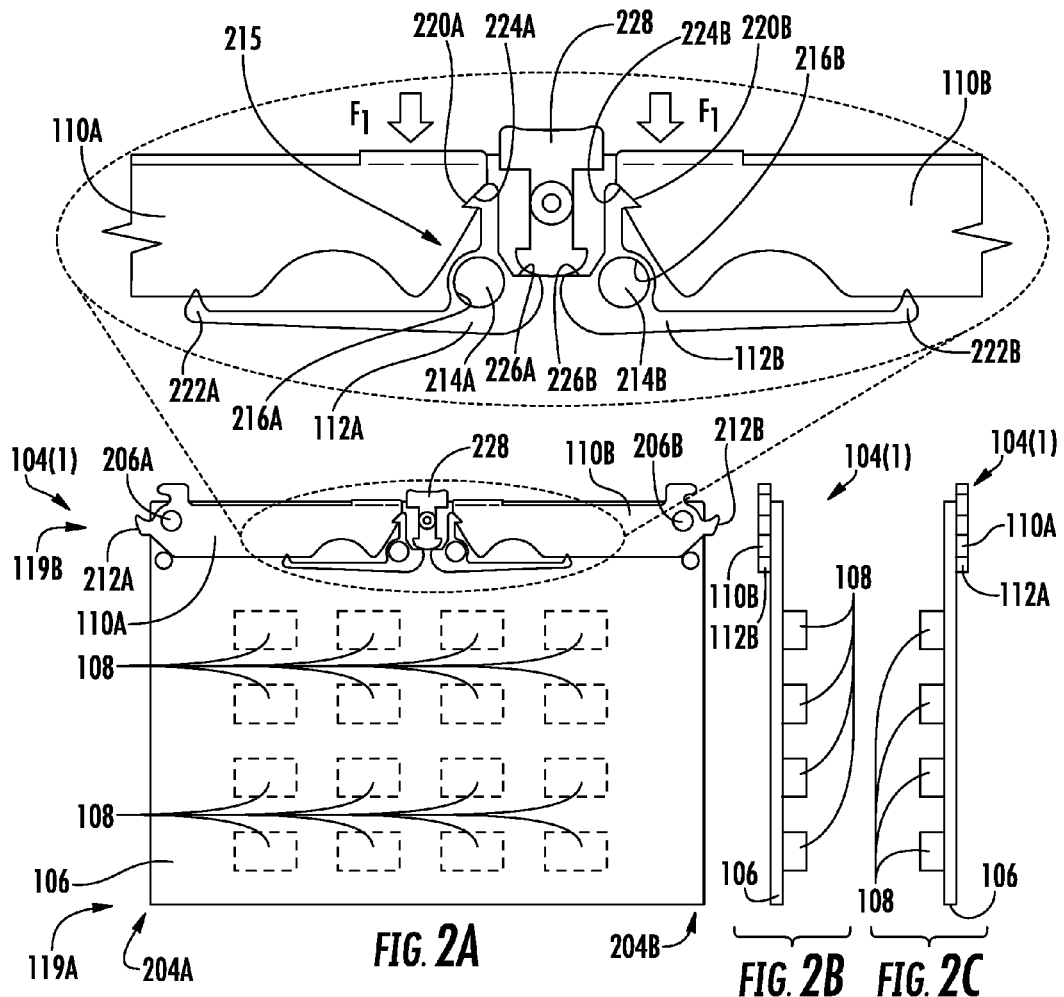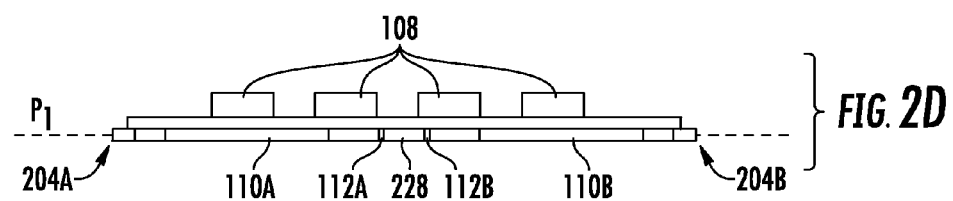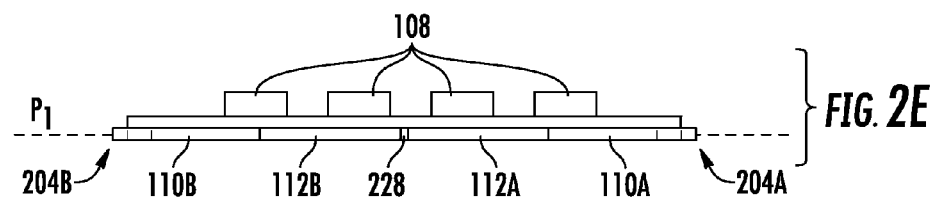

MODULAR ENCLOSURE ELEMENTS EMPLOYING CAMS FORMING DETENT FEATURES WITH LATCHES

BACKGROUND

The present disclosure relates to enclosure systems having removable equipment elements, and in particular, to electronic components supported by elements which are removably disposed in enclosures.

TECHNICAL BACKGROUND

Benefits of enclosures include an establishment of an internal volume that provides protection and organization of the contents therein. In some applications, enclosures form a structural framework and protection of internal volumes, for example, from electromagnetic radiation, humidity, moisture, and heat. Items to be disposed within the internal volumes of enclosures may be supported as part of modular elements which are secured to the structural framework of the enclosure during use. The structural framework also precisely positions and holds firmly the modular elements, so that the internal volume may be precisely populated to optimize cooling flow, resist vibration, maximize storage capacity, and/or provide convenient interfaces for modular elements to be efficiently replaced ("swapped out") by personnel without damage when maintenance and/or upgrades are required.

As technology improves, demands to reduce cost while simultaneously increasing performance continues, and there is an increasing need to populate enclosures with higher densities of components within enclosures to reduce the footprints of data centers and improve the speed of electronic components by decreasing the distances therebetween. With the resultantly highly-populated enclosures it is becoming more challenging to identify available volume within enclosures to route supply power cables and cooling air for components. Structural components of the enclosure and latching systems to secure the modular units to the enclosure are physically occupying spatial volume that could be occupied for additional electronic components or pathways for cooling air, communication cables, or power cords to support additional components in the enclosure. New approaches are needed to reliably secure modular units within enclosures while occupying minimum volume, and enabling efficient upgrades and maintenance.

SUMMARY

Embodiments disclosed herein include modular enclosure elements employing cams forming detent features with latches. A modular element may include a chassis body supporting electronic components. The modular element is removable from or secured to an enclosure using a latch. The latch may engage the enclosure and may remain engaged with the enclosure by being secured by interfacing with a cam. By forming the cam with a predetermined shape, a detent feature may be established with the latch to secure the latch and maintain the modular element locked to the enclosure. The latch may be disengaged from the cam by applying a disengagement motion to the cam and allow the latch to move relative to the chassis body and disengage from the enclosure. In this manner, the modular element is efficiently secured and removed from the enclosure with minimum obstruction to airflow to the electronic components.

According to one embodiment of the present invention, a modular element is disclosed. The modular element is removable from an enclosure during an unlocked mode and secured in enclosure during a locked mode. The modular element includes a chassis body supporting electronic components. The modular element further includes at least one latch in pivoting communication with the chassis body and configured to engage the enclosure during the lock mode. The modular element also includes at least one cam in pivoting communication with the chassis body and each including a shape having a catch cam extending in one direction and a cam arm extending in another direction, the catch cam and the cam arm are configured together to form a detent feature with the at least one latch during the lock mode. The detent feature secures the at least one latch with respect to the chassis body. The at least one cam includes an actuating surface configured to receive a disengagement motion which moves the at least one cam relative to the at least one latch during the unlock mode and which mobilizes the at least one latch relative to the chassis body to facilitate the disengagement of the chassis body from the enclosure. In this manner, the modular element may efficiently be secured and removed from the enclosure to enable hot swapping of electronic components for maintenance or upgrades.

According to one embodiment of the present invention, a method for securing and removing a modular element within an enclosure is disclosed. The method includes disposing at least a portion of a chassis body of the modular element within the enclosure, the chassis body supporting electronic components. The chassis body supporting electronic components, wherein the modular element includes at least one cam and at least one latch and both are in pivoting communication with the chassis body. The method further including securing the chassis body within the enclosure by moving the latch with respect to the chassis body to engage the at last one latch with the enclosure. The method also includes securing the at least one latch with respect to the chassis body by applying an installation force to the at least one latch to engage a lip of the at least one latch with a cam catch of the at least one cam and to form a slidable communication between a cam arm of the at least one cam and the at least one latch. The cam catch extends from an axis of rotation of the at least one cam in one direction and the cam arm extends from the axis of rotation of the at least one cam in another direction. In this manner, the modular element may efficiently be secured and removed from the enclosure with a reduced spatial volume enabling additional electronic components to populate the enclosure.

According to one embodiment of the present invention, an electronic device is disclosed. The electronic device includes an enclosure. The electronic device also includes a modular element removeable from the enclosure. The modular element includes a chassis body supporting electronic components. The modular element further includes a latch in pivoting communication with the chassis body and engaging the enclosure during a lock mode. The modular element also includes a cam in pivoting communication with the chassis body and including a shape forming a detent feature with the latch during a lock mode, wherein the detent feature prevents movement of the latch with respect to the chassis body. The cam includes an actuating surface configured to receive a disengagement motion which bends a cam catch and a cam arm of the cam further apart so as to disengage the cam catch of the cam from a lip of the latch during an unlock mode, and which mobilizes the latch relative to the chassis body to facilitate disengagement the chassis body from the enclosure. The cam catch extends from an axis of rotation of the at least one cam in one direction and the cam arm extends from the axis of rotation of the at least one cam in another direction. In this manner, a high flow of airflow can be supplied to the electronic components in the enclosure with the small volume occupied by the cam and latch.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 2A through 2G are a bottom view, right side view, left side view, front view, rear view, bottom perspective view, and bottom perspective exploded view of an exemplary one of the modular elements of FIG. 1;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numbers will be used to refer to like components or parts.

Figure 1:
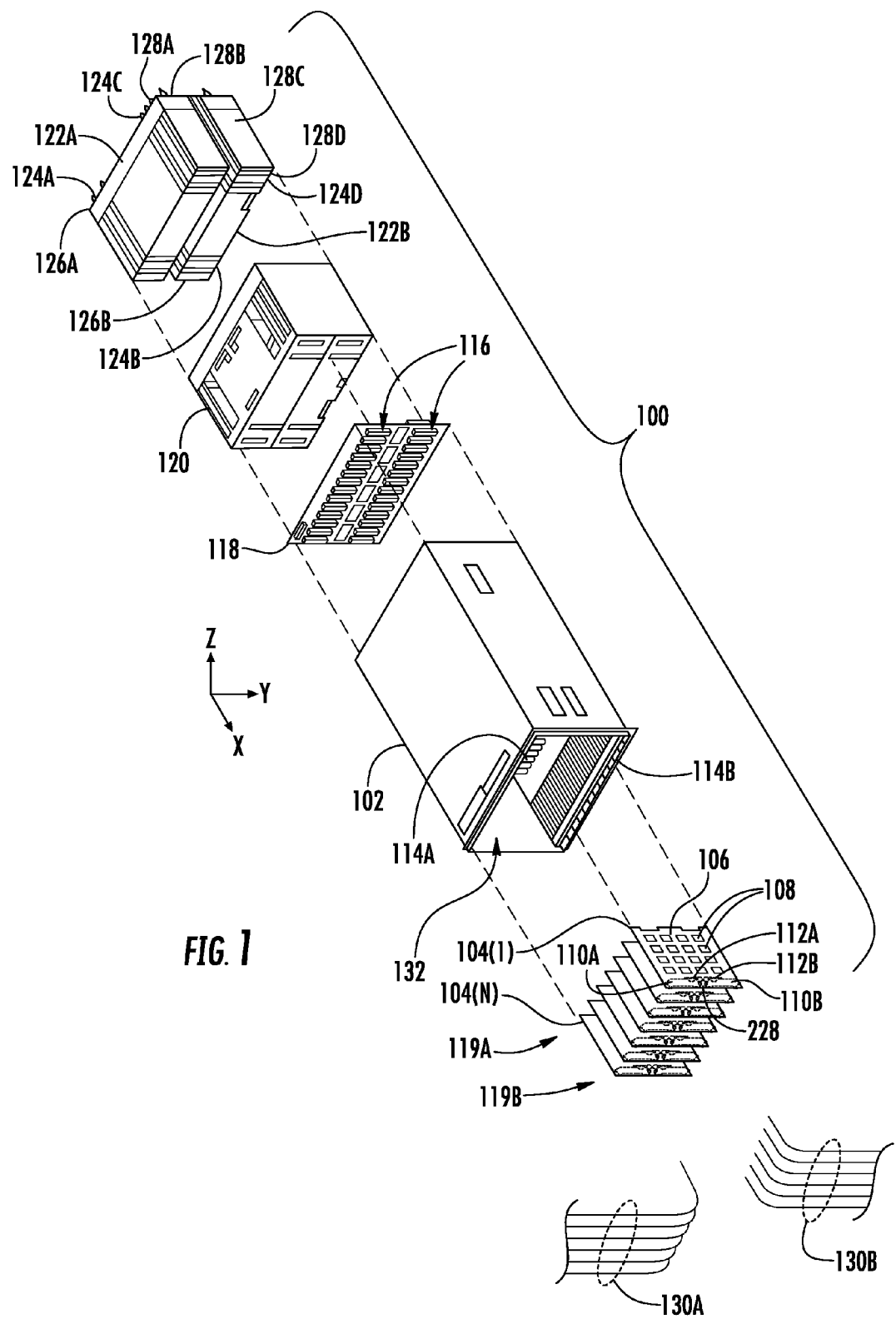
FIG. 1 is a top perspective exploded view of an exemplary electronic device including an enclosure and removable modular elements, wherein the modular elements each include a chassis body supporting electronic components, at least one latch, and at least one cam.
Figure 2F:
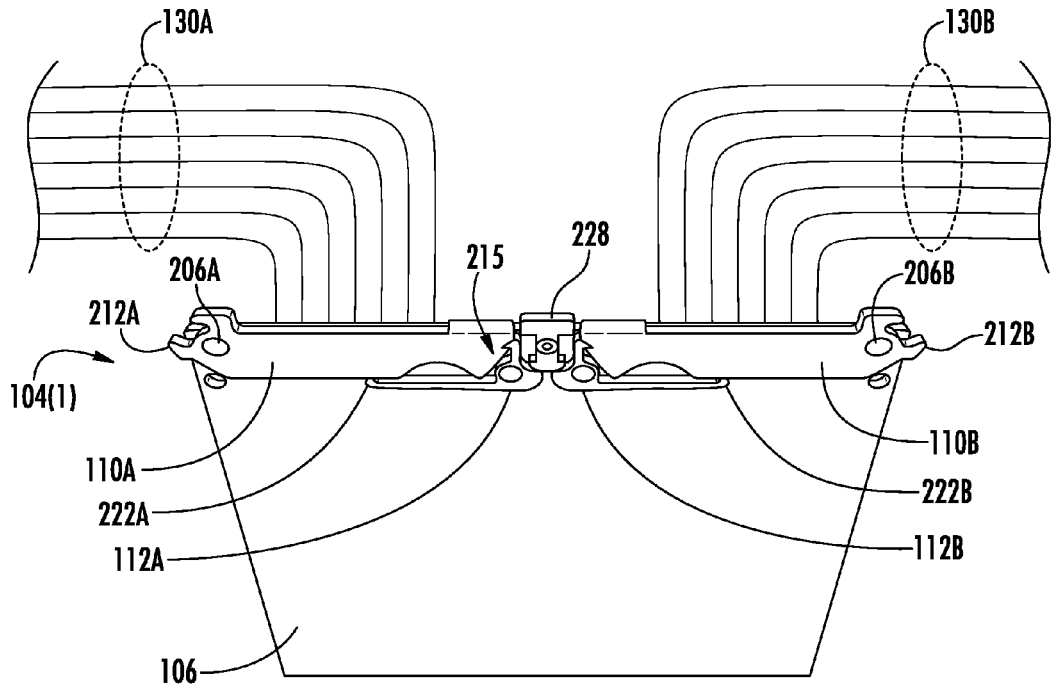
Figure 2G:
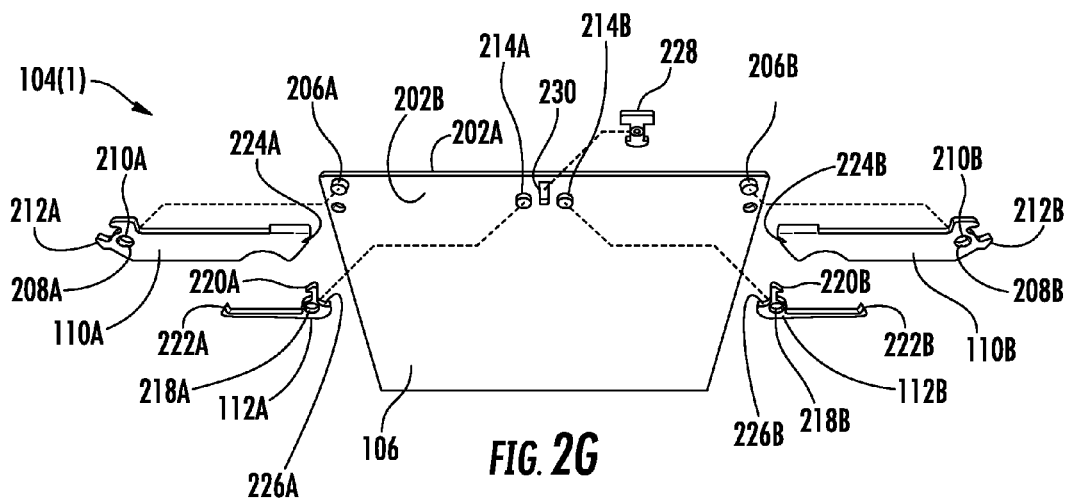

Embodiments disclosed herein include modular enclosure elements employing cams forming detent features with latches. A modular element may include a chassis body supporting electronic components. A modular element may include a chassis body supporting electronic components. The modular element is removable from or secured to an enclosure using a latch. The latch may engage the enclosure and may remain engaged with the enclosure by being secured by interfacing with a cam. By forming the cam with a predetermined shape, a detent feature may be established with the latch to secure the latch and maintain the modular element secured to the enclosure. The latch may be disengaged from the cam by applying a disengagement motion to the cam to remove the detent feature and allow the latch to unlock from the enclosure. In this manner, the modular element is efficiently secured and removed from the enclosure with minimum obstruction to airflow to the electronic components FIG. 1 is a top perspective exploded view of an exemplary electronic device 100 including an enclosure 102 and removable modular elements 104(1)-104(N) which may be individually installed and later removed from the enclosure 102. Each of the removable modular elements 104(1)-104(N) includes a chassis body 106 supporting electronic components 108, at least one latch 110A, 110B, and at least one cam 112A, 112B. As discussed in more detail below, the latches 110A, 110B may engage at least one receptor 114A, 114B of the enclosure 102 to secure the respective one of the modular element 104(1)-104(N) to the enclosure 102. The at least one cam 112A, 112B may include a shape to establish a detent feature with the latches 110A, 110B to secure the latches 110A, 110B and maintain the respective modular element 104(1) secured to the enclosure 102. A disengagement motion F2 (FIG. 4B) may be applied to the cams 112A, 112B to remove the detent feature and allow the latches 110A, 110B to disengage from the enclosure 102. In this manner, each of the modular elements 104(1)-104(N) may be removably secured to the enclosure 102.

The electronic components 108 may be supported to respective ones of the chassis bodies 106 of the modular elements 104(1)-104(N). The electronic components 108 may, for example, include semiconductor-based processor and/or semiconductor-based storage components. When the modular elements 104(1)-104(N) are secured in the enclosure 102, the electronic components 108 of the modular elements 104(1)-14(N) may also be coupled (not shown) at the back 119A of the modular elements 104(1)-104(N) to connector slots 116 of a midplane 118. The connector slots 116 may include power and a signal interfaces for the electronic components 108 to function and exchange information with a second chassis 120. The second chassis 120 may contain various hot plug-able components for cooling, power, control, and switching. The second chassis 120 may slide to and latch onto the enclosure 102. The second chassis 120 may contain hot plug-able blowers 122A, 122B include backward-curved impeller blowers and provide redundant cooling to various components of the electronic device 100. Airflow may be directed from the front to the rear of the second chassis 120. Each of the modular elements 104(1)-104(N) may includes a front grille to admit air, and low-profile vapor chamber based heat sinks to cool the electronic components 108. In one example, the total airflow through the electronic device 100s may be approximately 300 CFM at a 0.7 inch H2O static pressure drop.

With continued reference to FIG. 1, the electronic device 100 may also include power modules 124A-124D, management modules 126A, 126B, and switch modules 128A-128D. The power modules 124A-124D provide operating voltages for the electronic components 108. The management modules 126A, 126B may provide basic management functions, for example, controlling, monitoring, alerting, restarting, and diagnostics. The management modules 126A, 126B may have separate communications links (e.g. Ethernet) to the switch modules 128A-128D providing communications with the electronic components 108. In addition, communication cable groups 130A, 130B may be connected at a front 119B of the modular elements 104(1)-104(N). In this manner, power, communication, and environmental cooling may be provided to the electronic components 108 of the modular elements 104(1)-104(N).

FIGS. 2A through 2G are a bottom view, right side view, left side view, front view, rear view, bottom perspective view, and bottom perspective exploded view of the module element 104(1) of the modular elements 104(1)-104(N) of FIG. 1. In this regard, the module element 104(1) includes the chassis body 106, the at least one latch 110A, 110B, the at least one cam 112A, 112B, and may include a button 228. Each of these will now be discussed sequentially and in reference to the FIGS. 2A through 2G.

The chassis body 106 supports the electronic components 108 and serves as the structural foundation for each of the modular elements 104(1)-104(N). The chassis body 106 includes a first side 202A and a second side 202B opposite the first side 202A. The electronic components 108 may be attached to the first side 202A, second side 202B and/or within the chassis body 106. The first side 202A and the second side 202B extend from the front 119B to the back 119A of the modular element 104(1) and from a left side 204A of the modular element 104(1) to a right side 204B of the modular element 104(1). The chassis body 106 may comprise a strong material, for example, plastic, metal, or composites to prevent bending which may cause unwanted contact between adjacent modular elements 104(2)-104(N) and/or undesirable transient changes in cooling air passageways along the first side 202A and the second side 202B of the modular element 104(1). In this manner, the left side 204A and the right side 204B of the chassis body 106 are configured to be adjacent to or interface with the enclosure 102 to maximize the size of the modular element 104(1) for a given size of enclosure 102.

The chassis body 106 may provide electrical interconnection and may comprise a circuit board or other electronic interconnecting structure to provide power and intercommunication with the electronic components 108 supported thereon. The electronic devices 108 may be supported from one or more of the first side 202A and the second side 202B. In some cases the electronic devices 108 may be supported on an opposite side of the chassis body 106 from where the cams 112A, 112B and the latches 110A, 110B communicate with the chassis body 106. In this manner, movement of the cams 112A, 112B and the latches 110A, 110B may be unimpeded by a presence of the electronic devices 108 on the opposite side of the chassis body 106.

The latches 110A, 110B removably secure the chassis body 106 to the enclosure 102. The latches 110A, 110B respectively include catch portions 212A, 212B which are configured to be secured to the enclosure 102 by interfacing with the receptors 114A, 114B of the enclosure 102. The receptors 114A, 114B of the enclosure 102 may comprise holes or cavities within the enclosure 102 where when the catch portions 212A, 212B may be received. Once received, the receptors 114A, 114B prevent the latch 110A, 110B and the chassis body 106 attached to the latches 110A, 110B from being removed from the enclosure 102 until the catch portions 212A, 212B disengages from the receptors 114A, 114B.

The latches 110A, 110B are in pivotable communication with the chassis body 106. The pivotable communication may be created by spindles 206A, 206B which extend from the chassis body 106 and interface with inner surfaces 208A, 208B of the latches 110A, 110B. The inner surfaces 208A, 208B form respective holes 210A, 210B of the latches 110A, 110B. The latches 110A, 110B may pivot relative to the chassis body 106 as the spindles 206A, 206B interface with the inner surfaces 208A, 208B. The modular element 104(1) is moved along a direction X (see FIG. 1) to be disposed in the enclosure 102 and in a suitable position to be secured within the enclosure 102. In order to secure the chassis body 106 within the enclosure 102, the at least one latch 110A, 110B may pivot relative to the chassis body 106, so that the catch portion 212A, 212B of the at least one latch 110A, 110B moves at least partially parallel in the Y-direction and into the receptors 114A, 114B of the enclosure 102. The pivoting of the latches 110A, 110B may occur by applying an installation force F1 to each of the latches 110A, 110B as depicted in FIG. 2A.

While the catch portion 212A, 212B of the latches 110A, 110B remain disposed within the receptors 114A, 114B of the enclosure 102, the receptors 114A, 114B restrict movement of the catch portions 212A, 212B of the latches 110A, 110B in the X-direction. As long as the latches 110A, 110B remain stationary, the catch portions 212A, 212B of the latches 110A, 110B remain engaged in the receptors 114A, 114B of the enclosure 102 and the modular element 104(1) will be prevented from movement in the X-direction out of the opening 132 (FIG. 1) of the enclosure 102. The enclosure 102 may prevent movement of the chassis body 106 parallel to the Y-direction. In this manner, the latches 110A, 110B removably secure the modular element 104(1) within the enclosure 102 and place the modular element 104(1) in a locked mode.

The cams 112A, 112B secure the latches 110A, 110B engaged with the receptors 114A, 114B of the enclosure 102 while in the locked mode. Each of the cams 112A, 112B is a planar-shaped component configured to form a detent feature 215 (FIG. 2A) with the latches 110A, 110B to secure the latches 110A, 110B with respect to the chassis body 106. In particular, the term detent feature as used herein means that the cams 112A, 112B are positioned relative to the latches 110A, 110B to restrict the movement of the latches 110A, 110B relative to the chassis body 106 and thereby prevent the catch portions 212A, 212B of the latches 110A, 110B from disengaging from the receptors 114A, 114B of the enclosure 102. In this regard, the detent feature does not require a preload or abutment force to be applied by the cams 112A, 112B against the latches 110A, 110B, but merely that the cams 112A, 112B are positioned relative to the latches 110A, 110B to restrict the movement of the latches 110A, 110B relative to the chassis body 106 and thereby prevent the catch portions 212A, 212B of the latches 110A, 110B from disengaging from the receptors 114A, 114B of the enclosure 102. In one example, the shapes of the cams 112A, 112B may include respectively at least one cam catch 220A, 220B extending from axes of rotation of the cams 112A, 112B in one direction and at least one cam arm 222A, 222B extending in another direction. When forming the detent feature 215, the cams 112A, 112B are in pivotable communication with the chassis body 106 as the cam catches 220A, 220B engage with respective lips 224A, 224B of the latches 110A, 110B and the cam arms 222A, 222B form a slidable interface with the latches 110A, 110B. As the detent feature 215 is being formed the cams 112A, 112B may deform to enable the cam catches 220A, 220B and the cam arms 222A, 222B to separate and surround a portion of the latches 110A, 110B. When the portion is surrounded, the cam catches 220A, 220B are engaged with the lips 224A, 224B and the cam arms 222A, 222B are disposed adjacent to, and form, a slidable interface with the latches 110A, 110B. While the detent feature 215 is formed the cams 112A, 112B may optionally return to a neutral or non-deformed shape without applying the preload or compression force against the latches 110A, 110B. In this manner, the detent feature 215 is formed and the latches 110A, 110B remain secured with the catch portions 212A, 212B engaged in the receptors 114A, 114B of the enclosure 102 and the modular element 104(1) prevented from movement in the X-direction out of the opening 132 of the enclosure 102.

It is noted that to facilitate the pivoting communication of the cams 112A, 112B with respect to the chassis body 106, cam spindles 214A, 214B may extend from the chassis body 106 and interface with cam inner surfaces 216A, 216B (FIG. 2A) forming holes 218A, 218B (FIG. 2G) of the cams 112A, 112B. The cams 112A, 112B pivot relative to the chassis body 106 as the cam spindles 214A, 214B interface with the cam inner surfaces 208A, 208B establishing axes of rotation at the centers of the cam spindles 214A, 214B for the cams 112A, 112B. In this manner, the cams 112A, 112B may orientate relative to the latches 110A, 110B as the installation force F1 is applied to the latches 110A, 110B and the detent feature 215 is formed to secure the latches 110A, 110B.

The cams 112A, 112B also enable each of the modular elements 104(1)-104(N) to be removed from the enclosure 102. In this regard, the cams 112A, 112B respectively include actuating surfaces 226A, 226B to each receive a disengagement motion F2 to disengage the cam catches 220A, 220B of the cams 112A, 112B from the lips 224A, 224B of the latches 110A, 110B. In particular, the disengagement motion F2 causes bending of the cam arms 222A, 222B which slide along the latches 110A, 110B and enable the cams 112A, 112B to rotate about the cam spindles 214A, 214B and release the cam catches 220A, 220B from the lips 224A, 224B. In this manner, the latches 110A, 110B become free to move about the latch spindles 206A, 206B and disengage the catch portions 212A, 212B from the enclosure 102 to enable the modular element 104(1) to be removed from the enclosure 102. The modular elements 104(2)-104(N) may operate similarly.

The modular elements 104(1)-104(N) may utilize various approaches to apply the disengagement motion F2 to the actuating surfaces 226A, 226B. In one example depicted in FIG. 2A the modular element 104(1) may include a button 228 in communication with a slot 230 of the chassis body 106. The button 228 may receive the disengagement motion F2 from a user (not shown) and travel along the slot 230 as the button 228 transfers the disengagement motion F2 to the actuating surfaces 226A, 226B of the cams 112A, 112B. In this manner, the user may disengage the modular element 104(1) from the enclosure 102. The modular elements 104(2)-104(N) may operate similarly.

It is noted that the latches 110A, 110B, and the cams 112A, 112B of the modular element 104(1) may be disposed and/or move within a geometric plane P1 (see FIGS. 2D and 2E). This co-planar arrangement and movement has several benefits. Cooling airflow provided to the electronic components 108 may be increased as the latches 110A, 110B, and the cams 112A, 112B of the modular element 104(1) may be disposed adjacent to the chassis body 106. This adjacent arrangement provides minimal obstruction to the airflow (not shown) which may be directed parallel to the first side 202A and/or a second side 202B of the chassis body 106. Also, the latches 110A, 110B and the cams 112A, 112B may be made lighter and more compact to accommodate co-planar movements and forces within the geometric plane P1 and avoid more complex and/or unnecessary structure. The complex structure which has been avoided would be needed to accommodate movements and/or forces outside of the geometric plane P1. In this manner, the modular element 104(1) may more efficiently provide cooling to the electronic components 108 and reduce costs.

Figure 3:
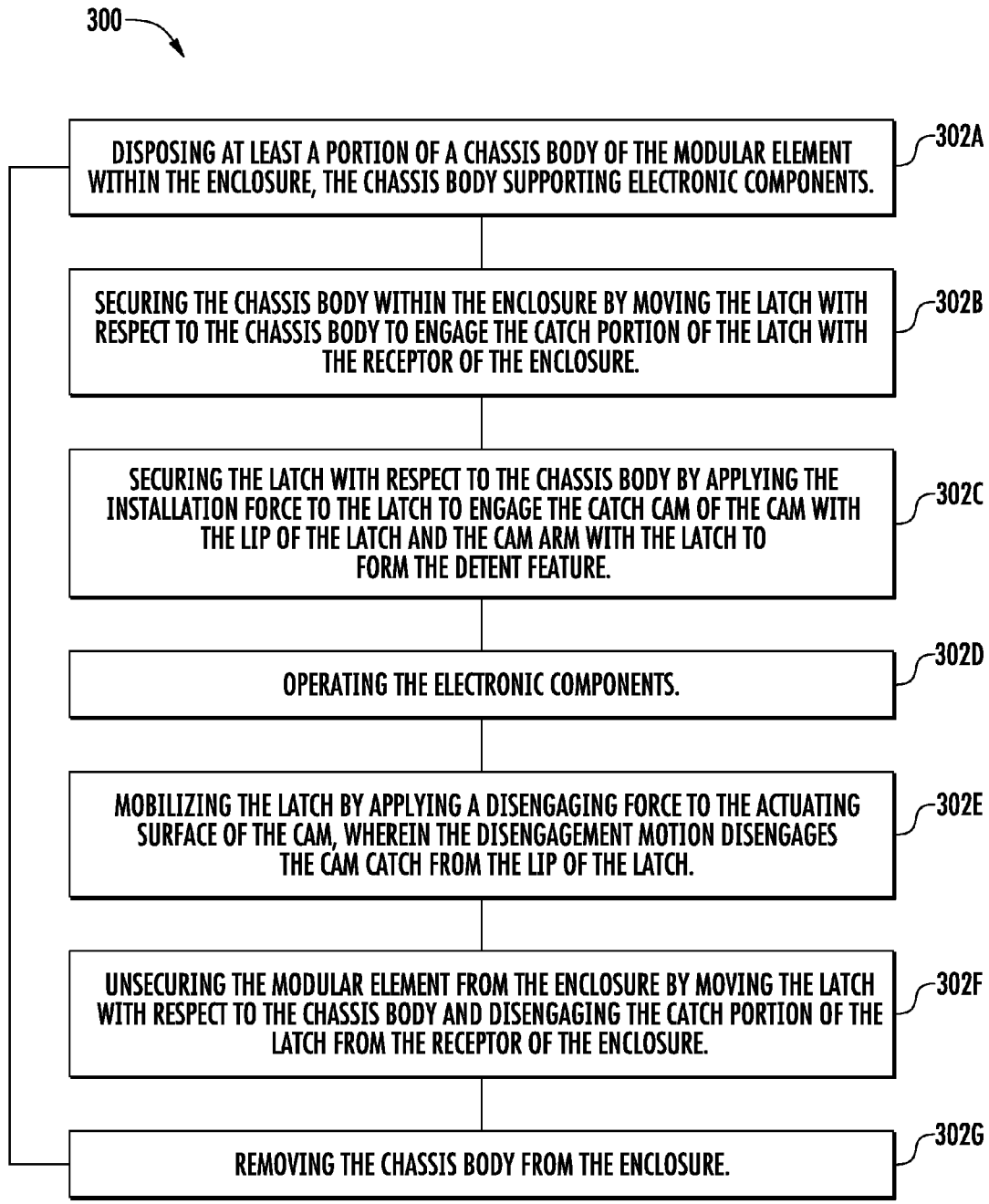
FIG. 3 is a flowchart of an exemplary method for securing and removing the modular element of FIG. 2A within the enclosure of FIG. 1.

FIG. 3 is a flowchart of an exemplary method 300 for securing the modular element 104(1) of FIG. 2A within the enclosure 102 of FIG. 1. The method 300 is now discussed using the terminology discussed above in relation to the operations 302A-302G as depicted in FIG. 3. In this regard, the method 300 includes disposing at least a portion of a chassis body 106 of the modular element 104(1) within the enclosure 102, wherein the chassis body 106 supports electronic components 108 (operation 302A of FIG. 3). The modular element 104(1) includes the cams 112A, 112B and the latches 110A, 110B which are in communication with the chassis body 106. The method 300 also includes securing the chassis body 106 within the enclosure 102 by moving the latches 110A, 110B with respect to the chassis body 106 and engaging the catch portions 212A, 212B of the latches 110A, 110B with the enclosure 102 (operation 302B of FIG. 3).

Figure 4A:
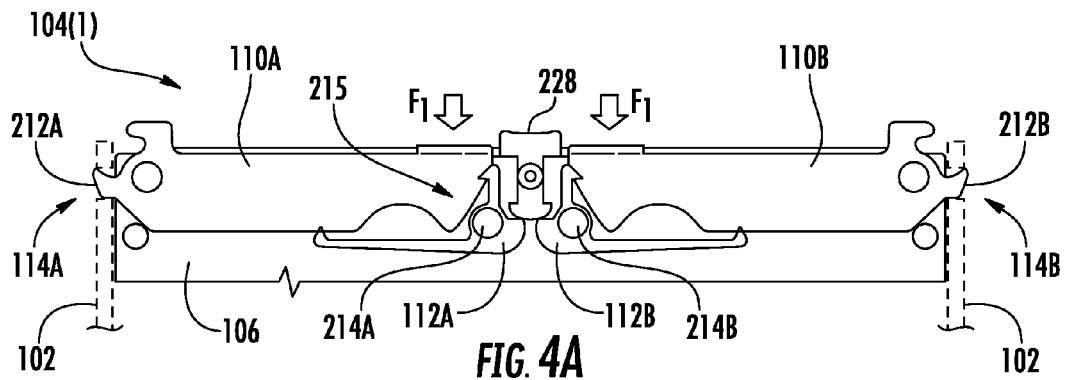
FIG. 4A is a bottom view of the modular element of FIG. 2A being secured to receptors of the enclosure and the at least one latch of the modular element being secured in the lock mode by a detent feature formed by a shape of the at least one cam of the modular element in pivotable communication with the chassis body and interfacing with the at least one latch.

As shown in FIG. 4A, the method 300 also includes securing the latches 110A, 110B with respect to the chassis body 106 by applying the installation force F1 to the latches 110A, 110B to engage the latches 110A, 110B with the cams 112A, 112B and form the detent feature 215 preventing movement of the latches 110A, 110B with respect to the chassis body 106 and the cams 112A, 112B. (operation 302C of FIG. 3).

Figure 4B:
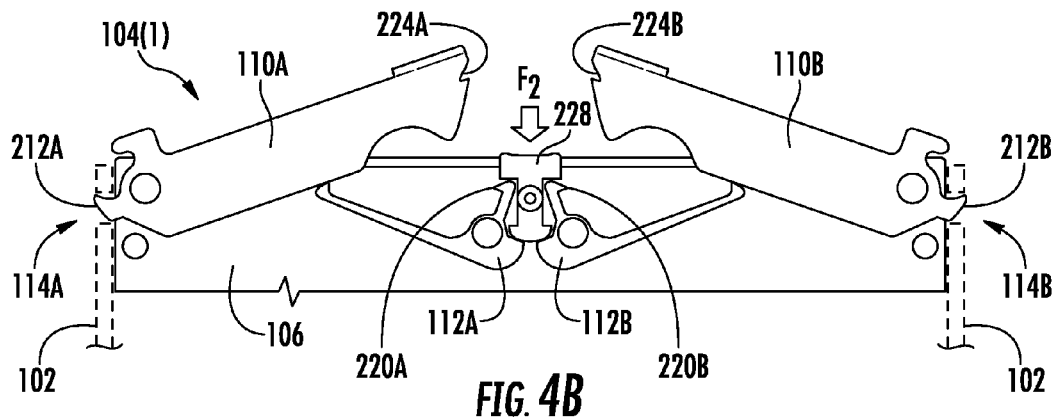
FIG. 4B is a bottom view of the modular element of FIG. 4A illustrating a disengaging movement being applied to the at least one cam of the modular element to mobilize the at least one latch.

The method 300 also includes operating the electronic components supported on the chassis body 106 (operation 302D of FIG. 3). One or more of the modular elements 104(1)-104(N) may be removed when maintenance or upgrades are required. When removal is initiated, the modular elements 104(1)-104(N) are unsecured from the enclosure 102 to facilitate removal. In this regard, as shown in FIG. 4B, the method 300 may include mobilizing the latches 110A, 110B by applying the disengagement motion F2 to the actuating surfaces 226A, 226B of the cams 112A, 112B (operation 302E of FIG. 3). The disengagement motion F2 moves the cam catches 220A, 220B and the cam arms 222A, 222B of the cams 112A, 112B further apart from each other and disengages the cam catches 220A, 220B from the lips 224A, 224B of the latches 110A, 110B. The method 300 may also include unsecuring the chassis body 106 from the enclosure 102 by moving the latches 110A, 110B with respect to the chassis body 106 and disengaging the catch portions 212A, 212B of the latches 110A, 110B from the enclosure 102 (operation 302F of FIG. 3).

Figure 4C:
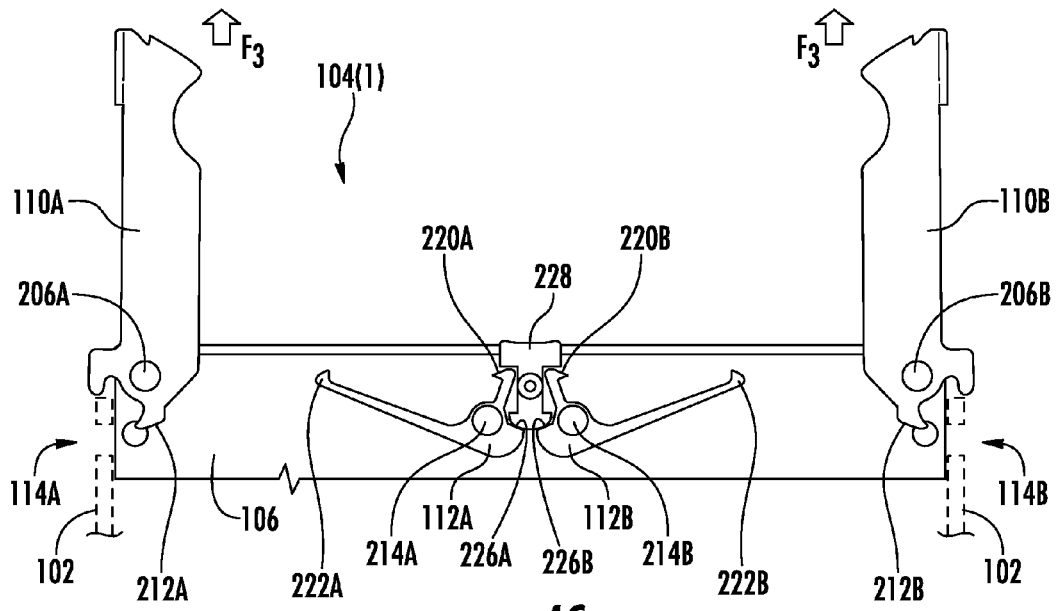
FIG. 4C is a bottom view of the modular element of FIG. 4B illustrating removing the modular element from the enclosure by applying a removal force to the at least one latch.

As depicted in FIG. 4C, the method may also include removing the modular element 104(1) from the enclosure 102 with an application of a removal force F3 to the latches 110A, 110B (operation 302G of FIG. 3). The modular element 104(1) may in some cases slide along a rail (not shown) of the enclosure 102 as the removal force F3 is applied. In this manner, the modular element 104(1) may be removed from the enclosure 102.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A modular element removable from an enclosure during an unlocked mode and secured in the enclosure during a locked mode, the modular element comprises:
   a chassis body supporting electronic components;
   at least one latch in pivoting communication with the chassis body and configured to engage the enclosure during the lock mode; and
   at least one cam in pivoting communication with the chassis body and each including a shape having a catch cam extending in one direction and a cam arm extending in another direction, the catch cam and the cam arm are configured together to form a detent feature with the at least one latch during the lock mode, wherein the detent feature secures the at least one latch with respect to the chassis body,
   wherein the at least one cam includes an actuating surface configured to receive a disengagement motion that results in the cam arm slidably engaging the at least one latch in a manner that moves the at least one latch relative to the chassis body to facilitate the disengagement of the chassis body from the enclosure.

2. The modular element of claim 1, further comprising a disengagement button in communication with the chassis body, wherein the disengagement button is configured to convey the disengagement motion applied to the disengagement button from a user to the actuating surface.

3. The modular element of claim 1, wherein the at least one latch and the at least one cam communicate with the chassis body through respective spindles configured to provide relative rotational motion therebetween.

4. The modular element of claim 3, wherein the spindles comprise cylindrically-shaped protrusions extending from the chassis body and interfacing with circular-shaped holes of the at least one latch and the at least one cam.

5. The modular element of claim 1, wherein the cam catch and the cam arm of the at least one cam are configured to move apart upon receiving the disengagement motion at the actuating surface.

6. The modular element of claim 5, wherein the at least one cam comprises a strong resilient material which bends upon receiving the disengagement motion at the actuating surface to move the cam catch and the cam arm of the at least one cam further apart from each other and disengage the cam catch from the lip of the at least one latch.

7. The modular element of claim 1, wherein the at least one latch and the at least one cam are disposed within a geometric plane.

8. The modular element of claim 1, wherein the cam catch of the at least one cam is configured to be disposed within the lip of the at least one latch during the lock mode.

9. The modular element of claim 1, wherein the electronic components include at least one of: semiconductor-based information storage devices, semiconductor-based processor devices, electrical connectors, and fiber optic connectors.

10. The modular element of claim 1, wherein the chassis body includes a first side and a second side opposite of the first side, wherein the electronic components are disposed at the first side and the at least one cam and the at least one latch are in communication with the second side.

11. The modular element of claim 1, wherein the cam arm and cam catch are configured to be resiliently flexed away from each other by the at least one latch when the at one the least one latch is pressed between the cam catch and the cam arm by applying an installation force to the at least one latch.

12. An electronic device, comprising:
   an enclosure;
   a modular element removable from the enclosure, wherein the modular element includes:
      a chassis body supporting electronic components;
      a latch in pivoting communication with the chassis body and engaging the enclosure during a lock mode;
      a cam in pivoting communication with the chassis body and including a shape forming a detent feature with the latch during a lock mode, wherein the detent feature prevents movement of the latch with respect to the chassis body,
   wherein the cam includes an actuating surface configured to receive a disengagement motion which bends a cam catch and a cam arm of the cam further apart so as to disengage the cam catch of the cam from a lip of the latch during an unlock mode, and which mobilizes the latch relative to the chassis body to facilitate disengagement of the chassis body from the enclosure,
   wherein the cam catch extends from an axis of rotation of the at least one cam in one direction and the cam arm extends from the axis of rotation of the at least one cam in another direction.

13. The electronic device of claim 12, wherein the modular element further comprises:
   a button in translation communication with the chassis body and disposed to receive the disengagement motion from the user and apply the disengagement motion to the actuating surface.

14. A modular element comprising:
   a chassis body; and
   a locking assembly connected to the chassis body configured to adjust between a locked mode in which the modular element is securable in an enclosure and an unlocked mode in which the modular element is removable from the enclosure, the locking assembly including a latch configured to pivot relative to the chassis body and a cam configured to pivot relative to the chassis body, the latch including a retaining lip, the cam including a cam catch, a cam arm and an actuating surface, the cam and latch being oriented such that the retaining lip engages the cam catch when the locking assembly is in the locked mode, the cam being adapted such that the cam catch disengages from the retaining lip when a disengagement force applied to the actuating surface results in the cam arm and cam catch resiliently flexing away from each other.

15. The modular element of claim 14 wherein the modular element comprises a button in translation communication with the locking assembly, the button configured to apply the disengagement force to the actuating surface.

16. The modular element of claim 14 wherein the cam and latch are oriented such that the cam arm slides along a portion of the latch when the locking assembly is adjusted between the locked mode and the unlocked mode.

17. The modular element of claim 14 wherein the modular element comprises electrical components supported by the chassis body.

* * * * *